United States Patent
Aizawa et al.

(10) Patent No.: US 11,380,579 B2
(45) Date of Patent: Jul. 5, 2022

(54) METHOD AND PROCESS USING DUAL MEMORIZATION LAYER FOR MULTI-COLOR SPACER PATTERNING

(71) Applicant: Tokyo Electron Limited, Tokyo (JP)

(72) Inventors: Hirokazu Aizawa, Albany, NY (US); Kaoru Maekawa, Albany, NY (US); Akiteru Ko, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 131 days.

(21) Appl. No.: 16/864,472

(22) Filed: May 1, 2020

(65) Prior Publication Data

US 2021/0343586 A1 Nov. 4, 2021

(51) Int. Cl.
*H01L 21/768* (2006.01)
*H01L 23/532* (2006.01)

(52) U.S. Cl.
CPC .. *H01L 21/76816* (2013.01); *H01L 21/76831* (2013.01); *H01L 21/76897* (2013.01)

(58) Field of Classification Search
CPC ......... H01L 21/76816; H01L 21/76831; H01L 21/76897; H01L 21/308; H01L 21/3065; H01L 21/0338; H01L 21/0335; H01L 21/0337
See application file for complete search history.

(56) References Cited

U.S. PATENT DOCUMENTS

| | | | |
|---|---|---|---|
| 8,906,807 B2* | 12/2014 | Bergendahl | H01L 21/3086 438/696 |
| 9,691,775 B1* | 6/2017 | Licausi | H01L 21/3086 |
| 9,722,052 B2* | 8/2017 | Cheng | H01L 21/823431 |
| 9,741,823 B1* | 8/2017 | Greene | H01L 21/845 |
| 9,859,120 B1* | 1/2018 | Sun | H01L 21/76816 |
| 10,629,436 B2* | 4/2020 | Mignot | H01L 21/0337 |
| 10,734,289 B2* | 8/2020 | Cheng | H01L 27/0886 |
| 2015/0093899 A1* | 4/2015 | Huang | H01L 21/76877 438/692 |
| 2017/0352585 A1* | 12/2017 | Burns | H01L 23/528 |
| 2018/0005898 A1* | 1/2018 | Cheng | H01L 21/823431 |
| 2018/0076033 A1* | 3/2018 | Bergendahl | H01L 21/31155 |
| 2018/0114721 A1* | 4/2018 | Mohanty | H01L 21/76811 |
| 2019/0035638 A1* | 1/2019 | Fan | H01L 21/0337 |
| 2019/0189444 A1* | 6/2019 | Sun | H01L 21/0337 |
| 2020/0111668 A1* | 4/2020 | O'Toole | H01L 21/31144 |
| 2020/0194261 A1* | 6/2020 | Ko | H01L 21/31116 |
| 2020/0343361 A1* | 10/2020 | Cheng | H01L 29/66545 |
| 2021/0242020 A1* | 8/2021 | O'Meara | H01L 21/0338 |

* cited by examiner

*Primary Examiner* — Mohsen Ahmadi

(57) ABSTRACT

A self-aligned multiple patterning (SAMP) multi-color spacer patterning process is disclosed for formation of structures on substrates. Trenches and vias may be formed in the process. A trench memorization layer and a via memorization layer may be formed on the substrate. In one embodiment, the trench memorization layer and the via memorization layer are formed between the multi-color spacer patterning structures and a low-k interlayer dielectric layer. The use of the trench memorization layer and the via memorization layer allows the formation of trenches and vias in the low-k interlayer dielectric layer without causing damage to the low-k properties of the low-k interlayer dielectric layer.

18 Claims, 10 Drawing Sheets

US 11,380,579 B2

METHOD AND PROCESS USING DUAL MEMORIZATION LAYER FOR MULTI-COLOR SPACER PATTERNING

BACKGROUND

The present disclosure relates to the processing of substrates. In particular, it provides a novel method for forming patterns during the processing of substrates.

As geometries in substrate processing continue to shrink, the technical challenges to forming structures on substrates via photolithography techniques increase. As requirements for smaller geometry structures arose, a variety of photolithography techniques have been utilized for achieving suitable photolithography for such structures, including extreme ultraviolet (EUV) lithography, multiple patterning schemes (including self-aligned multiple patterning (SAMP) schemes such as, for example, self-aligned double patterning (SADP), self-aligned triple patterning (SATP), self-aligned quadruple patterning (SAQP), self-aligned octuple patterning (SAOP), etc.), or other small geometry patterning methods. Conventional SAMP processes may superimpose two or more multi-color pattern arrays to form the various designed structures on a substrate by selectively cutting overlapping portions of materials.

The formation of trench and vias are process steps in which SAMP techniques have been particularly useful. SADP, SAQP, SAOP processes may utilize a mandrel (or core) structure having spacers formed on the sides of the mandrel to increase the structure density of the substrate surface. For example, in SADP, a mandrel structure may be formed on the substrate through known photolithography techniques. Sidewall spacers may then be formed adjacent the mandrel. At some point, removal of the originally patterned mandrel leaves the two sidewall spacers, thus forming two structures for each mandrel. Similarly, self-aligned quadruple patterning techniques are known. Multiple patterning techniques generally include the use of multiple masking steps. For example, in one example, a first step may be called the mandrel mask and a second step may be called the block mask. Together, the two (or more) masking steps may form the desired pattern.

FIGS. 1A-1G illustrate an exemplary known process for forming trench and vias using a SAMP multi-color spacer patterning process. As shown in FIG. 1A, a substrate 100 has a plurality of patterned layers and underlying layer(s) 102. The patterned layers may include mandrels 105 (also known as core layers), spacers 110 and filled gaps 115. To achieve the patterned structures shown in FIG. 1A, mandrels 105 may first be created using patterning techniques known in the art, including for example, photolithography techniques. Mandrels 105 may be formed of a wide variety of materials, including but not limited to, silicon, silicon nitride, hardmask materials, spin on carbon (SOC), photoresist, silicon oxide, etc. Then, the spacers 110 are formed on the sides of the mandrels. The spacers similarly may be made from any of a wide variety of materials, including but not limited to oxides, nitrides, titanium oxide, etc. Spacers may be formed by use of a conformal deposition process (including but not limited to atomic layer deposition (ALD) techniques, chemical vapor deposition (CVD) techniques, etc. and a follow on spacer etch. Gaps between spacers subsequently are filled to form the filled gaps 115. Filled gaps 115 may be formed by filling gaps between a spacer using ALD, CVD, spin-on, etc. techniques to form materials such as silicon oxide, SOC, titanium oxide, aluminum oxide, etc. in the gaps followed by an etch back or planarization step. Gaps between spacers subsequently are filled to form the filled gaps 115. During the processing of the various patterned layers, the structures may result in a substantially planar structure as shown in FIG. 1A utilizing known substrate processing techniques. One exemplary embodiment for formation of the structure of FIG. 1A is disclosed in U.S. patent application Ser. No. 16/836,239 entitled "Substrate Processing Method Using Multiline Patterning," filed Mar. 31, 2020, the disclosure of which is expressly incorporated by reference herein in its entirety. As shown in FIG. 1A, an interlayer dielectric layer 120 which is a low dielectric constant (low-k) material, such as for example SiOCH, Hydrogen Silsesquioxane (HSQ) or Methylsilsesquioxane (MSQ), is provided. A first etch stop layer 122, such as for example titanium nitride, silicon nitride, silicon carbon nitride (SiCN), or carbon doped silicon oxide (SiOC) is also provided. A second etch stop layer 125, such as for example SiCN, SiOC, aluminum oxide, or aluminum nitride is also provided. It will be recognized that the materials and layers described above are merely exemplary and other layers and materials may be utilized as is well known in the art.

The patterning of the structure of FIG. 1A to form a via for may then proceed as shown in FIG. 1B. Specifically, as shown in FIG. 1B, the substrate 100 has a via patterned layer 140 formed via any of a variety of patterning techniques. One or more additional layers 145 may also be formed above the patterned layers of FIG. 1A as shown in FIG. 1B. Using the via patterned layer 140 as an etch mask, an etch may be utilized which etches exposed portions of the spacers 110 and the interlayer dielectric layer 120. Such an etch may be selective to the materials of the mandrels 105 and filled gaps 115 so as to provide the post etch structure having a via region 148 as shown in FIG. 1C with the patterned layer 140 removed. Then, as shown in FIG. 1D, the additional layers 145 may be removed and a via fill layer 150 may be provided to fill the via region 148. Via fill layer 150 may be formed, for example, of SOC or other spin-on organic material.

Then etching planarization techniques can be utilized to expose the spacer regions and an etch which selectively removes the spacers 110 may be utilized to yield a structure such as shown in FIG. 1E. The pattern caused by the removal of the spacers 110 may then be utilized for forming trenches 160 in the interlayer dielectric layer 120 as shown in FIG. 1F. Finally, the via fill layer 150 may be removed from the via region 148 as shown in FIG. 1G. Typical techniques used to remove the via fill layer 150 include plasma etching. However, even though a plasma etch having selectivity between the via fill material and the low-k material that forms the interlayer dielectric layer 120 may be used, such plasma etch techniques may still damage the surface of the interlayer dielectric layer 120. In particular, the surface damage may degrade the low-k properties of the interlayer dielectric layer 120 such that the electrical properties of the structures being formed on the substrate 100 may be compromised. FIG. 1G illustrates the structure formed on the substrate after the via fill removal step (and removal of other patterned layers) leaving trenches 160 and a via region 148 in the interlayer dielectric layer 120 and a low-k damaged area 170 at the surfaces of the interlayer dielectric layer 120.

It would be desirable to provide an improved technique for forming patterns on a substrate. More specifically, it would be desirable to provide a multi-color spacer patterning process for the formation of trench and vias which does not damage a low-k layer within which the trench and via is formed.

SUMMARY

A self-aligned multiple patterning (SAMP) multi-color spacer patterning process is disclosed for formation of structures on substrates. Trenches and vias may be formed in the process. A trench memorization layer and a via memorization layer may be formed on the substrate. In one embodiment, the trench memorization layer and the via memorization layer are formed between the multi-color spacer patterning structures and a low-k interlayer dielectric layer. The use of the trench memorization layer and the via memorization layer allows the formation of trenches and vias in the low-k interlayer dielectric layer without causing damage to the low-k properties of the low-k interlayer dielectric layer.

In one embodiment, a method of forming patterned layers on a substrate using a self-aligned multiple patterning (SAMP) process is provided. The method comprises providing a SAMP array pattern, the SAMP array pattern comprising a plurality of features and providing a first layer to be etched at least in part according to the SAMP array pattern. The method further comprises providing a first memorization layer between the SAMP array pattern and the first layer and providing a second memorization layer between the SAMP array pattern and the first layer. The method also comprises providing a masking layer having a masking layer pattern overlying the SAMP array pattern and utilizing the masking layer to selectively etch at least a first feature of the plurality of features and to etch first memorization layer to form a first memorization layer pattern, the first memorization layer pattern related to the masking layer pattern. The method further comprises removing the masking layer and removing at least a second feature of the plurality of features to form at least one opening in the SAMP array pattern. The method further comprises etching the second memorization layer according to a pattern of the at least one opening in the SAMP array pattern to form a second memorization layer pattern, etching the first layer while utilizing the first memorization layer pattern to form a first structure pattern in the first layer, and etching the first layer while utilizing the second memorization layer pattern to form a second structure pattern in the first layer.

In some embodiments of the method the first layer is a dielectric layer. In some embodiments, the dielectric layer is a low-k dielectric layer.

In some embodiments of the methods, the first structure pattern is a via pattern and the second structure pattern is a trench pattern. Further, in some embodiments, the first feature of the plurality of features is a first spacer and the second feature of the plurality of features is a second spacer.

In some embodiments of the methods, an etch stop layer is utilized to protect at least a portion of the first layer while removing the at least a second feature of the plurality of features to form the at least one opening in the SAMP array pattern.

In another embodiment, a method of forming trenches and vias on a substrate using a self-aligned multiple patterning (SAMP) process is provided. The method may comprise providing a SAMP array pattern, the SAMP array pattern comprising a plurality of features, the plurality of features comprising at least mandrels and spacers. The method further comprises providing a dielectric layer within which the trenches and vias are to be formed, providing a via memorization layer between the SAMP array pattern and the dielectric layer, providing a trench memorization layer between the SAMP array pattern and the dielectric layer, and providing a masking layer having a masking layer pattern overlying the SAMP array pattern. The method also comprises utilizing the masking layer to selectively etch at least a one of the spacers and to etch in the via memorization layer a via memorization layer pattern, the via memorization layer pattern corresponding to a via pattern to be formed in the dielectric layer. The method further comprises removing the masking layer and removing at least a second spacer to form at least one opening in the SAMP array pattern. The method further comprises etching the trench memorization layer according to a pattern of the at least one opening in the SAMP array pattern to form a trench memorization layer pattern, etching the dielectric layer while utilizing the via memorization layer pattern to form a via pattern in the dielectric layer, and etching the dielectric layer while utilizing the trench memorization layer pattern to form a trench pattern in the dielectric layer.

In some embodiments, the via memorization layer underlies the trench layer memorization layer. The method may further comprise, after forming the via pattern in the dielectric layer, utilizing the trench memorization layer pattern to etch exposed portions of the via memorization pattern. In some embodiments, an etch stop layer is utilized to protect at least a portion of the dielectric layer while removing the at least the second spacer to form the at least one opening in the SAMP array pattern. In some embodiments, the dielectric layer is a low-k dielectric layer and the method protects the low-k dielectric layer from damage to low-k properties of the low-k dielectric layer. In some embodiments, an etch stop layer is utilized to protect at least a portion of the dielectric layer while removing the at least the second spacer to form the at least one opening in the SAMP array pattern.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

A self-aligned multiple patterning (SAMP) multi-color spacer patterning process is disclosed for formation of structures on substrates. Trenches and vias may be formed in the process. A trench memorization layer and a via memorization layer may be formed on the substrate. In one embodiment, the trench memorization layer and the via memorization layer are formed between the multi-color spacer patterning structures and a low-k interlayer dielectric layer. The use of the trench memorization layer and the via memorization layer allows the formation of trenches and vias in the low-k interlayer dielectric layer without causing damage to the low-k properties of the low-k interlayer dielectric layer.

Figure 1A:
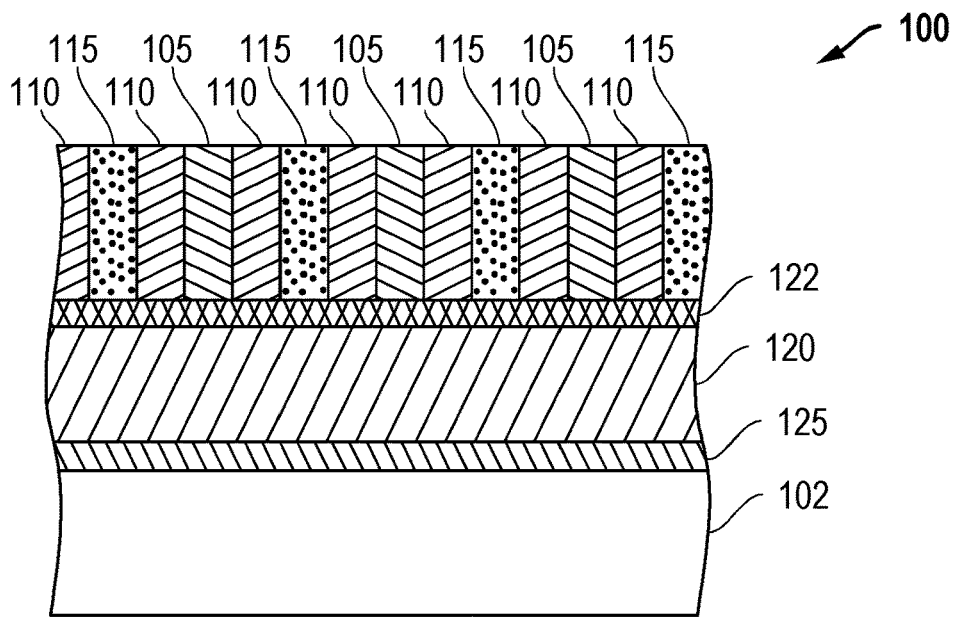
FIGS. 1A-1G illustrate a prior art process for forming vias and trenches.
Figure 1B:
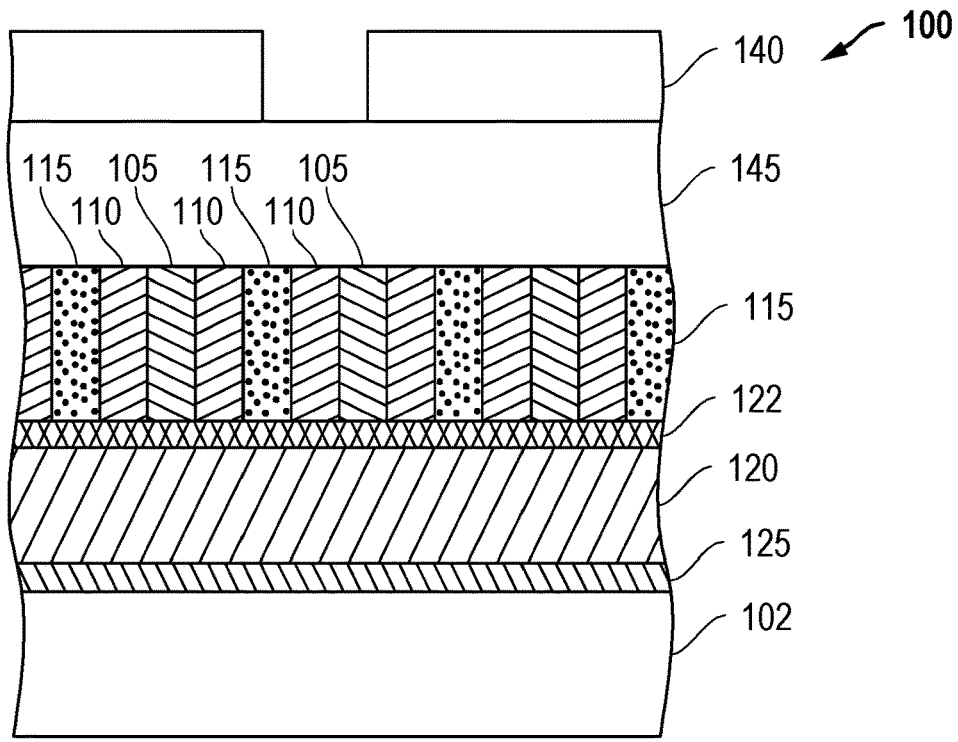
Figure 1C:
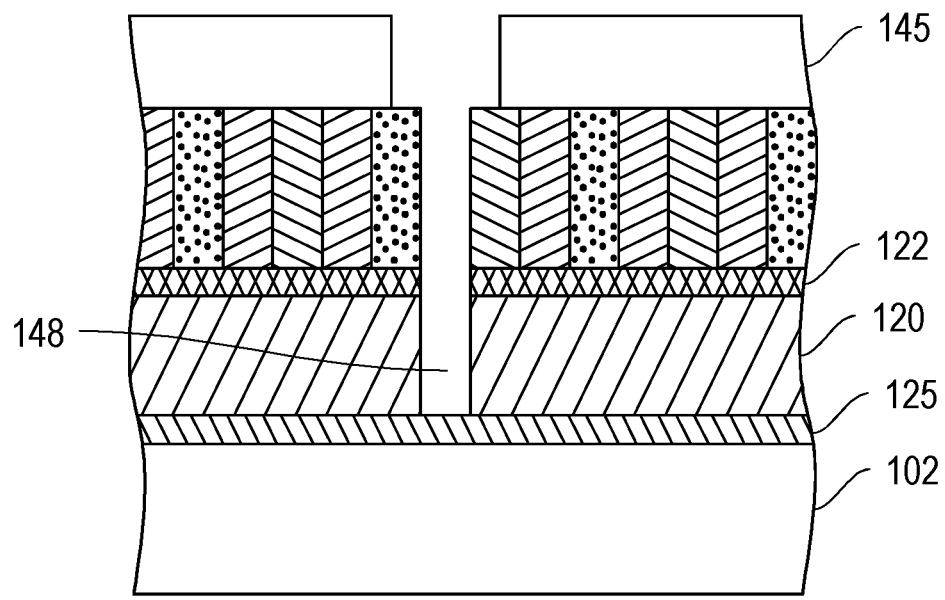
Figure 1D:
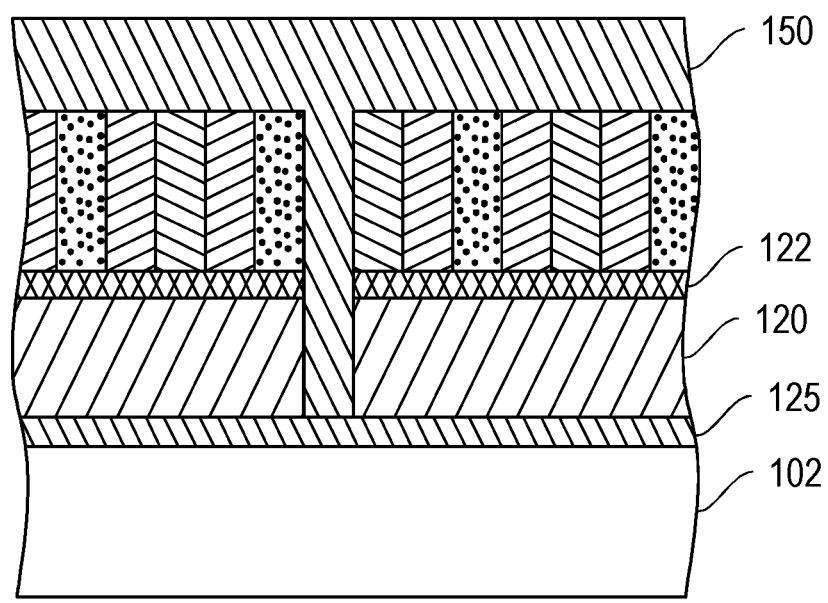
Figure 1E:
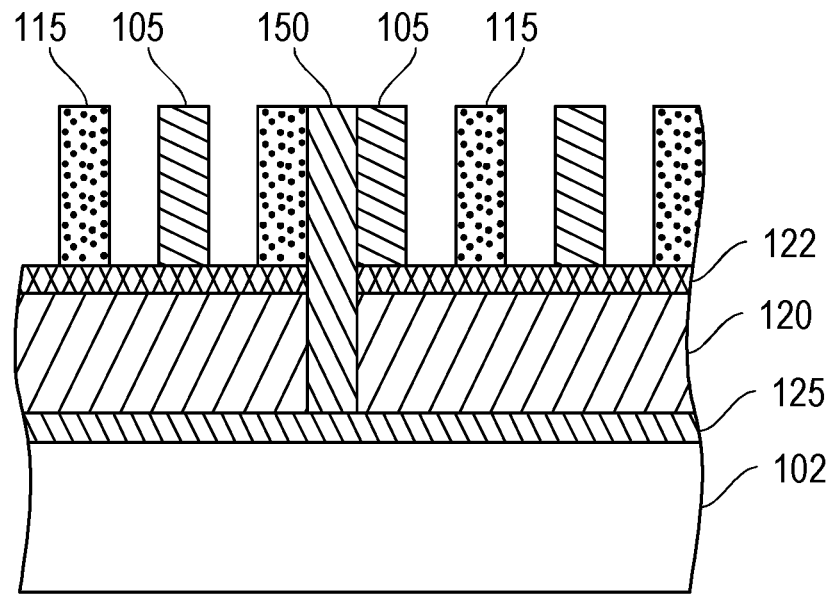
Figure 1F:
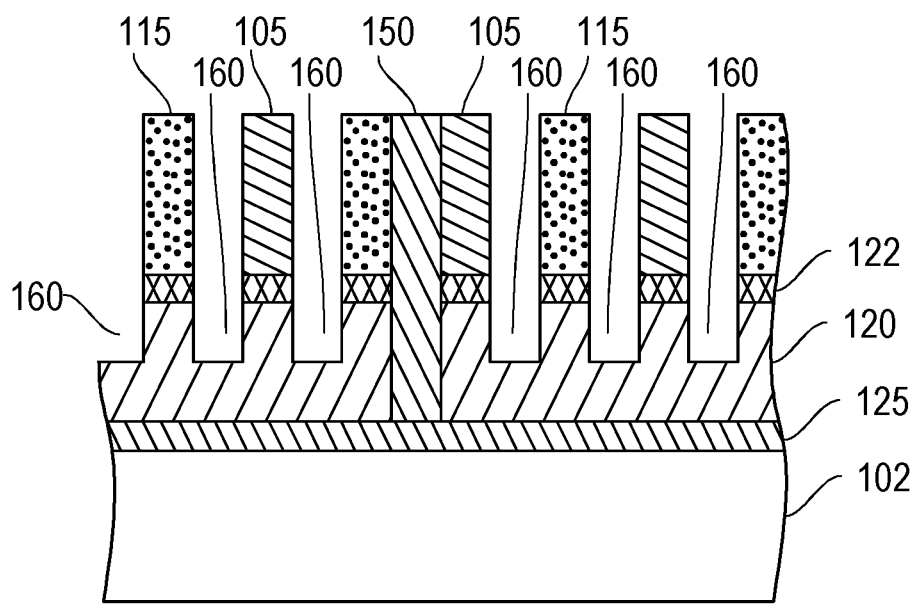
Figure 1G:
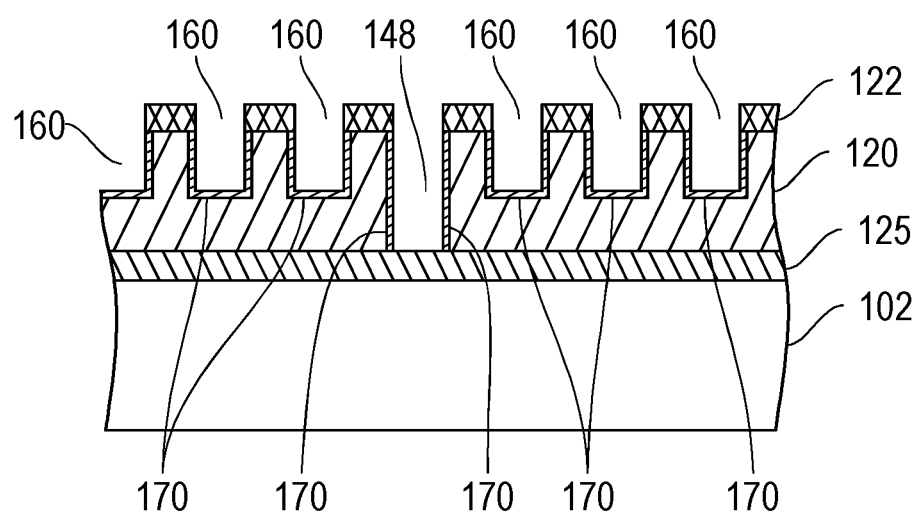
Figure 2A:
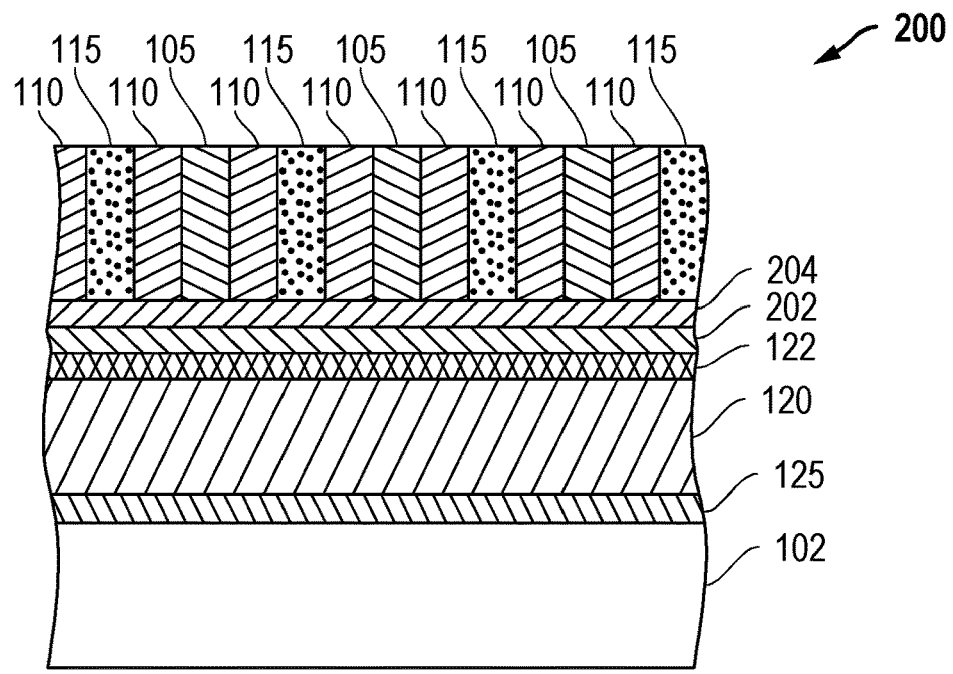
FIGS. 2A-2G illustrate a process for forming vias and trenches according to the techniques disclosed herein.

An exemplary process flow for patterning a substrate 200 according to the techniques disclosed herein is provided in FIGS. 2A-2G. As shown in FIG. 2A, a multi-color pattern structure similar to that shown in FIG. 1A is provided. In FIGS. 2A-2G, the various layers and materials that are the same as those shown in FIG. 1A-1G are like numbered between the two figures. It will be recognized by those skilled in the art that the particularly materials used and described in the figures are merely exemplary, and a wide range of materials may be utilized depending upon the particular process flow for which the SAMP techniques are being utilized. The structures and materials of FIG. 2A are generally the same as in FIG. 1A except FIG. 2A differs from FIG. 1A in that additional layers are provided between the multi-color pattern array (mandrels 105, spacers 110 and filled gaps 115) and the interlayer dielectric layer 120. In particular, a via memorization layer 202 underlies a trench memorization layer 204 as shown in the structure of FIG. 2A as shown. Exemplary materials for use as a via memorization layer 202 include, but are not limited to, silicon oxide, silicon nitride, titanium nitride, tantalum nitride, tungsten carbide or ruthenium. Exemplary materials for use as a trench memorization layer 204 include, but are not limited to silicon oxide, silicon nitride, titanium nitride, tantalum nitride, tungsten carbide or ruthenium. It will be recognized that such layers are merely exemplary embodiments however.

Figure 2B:
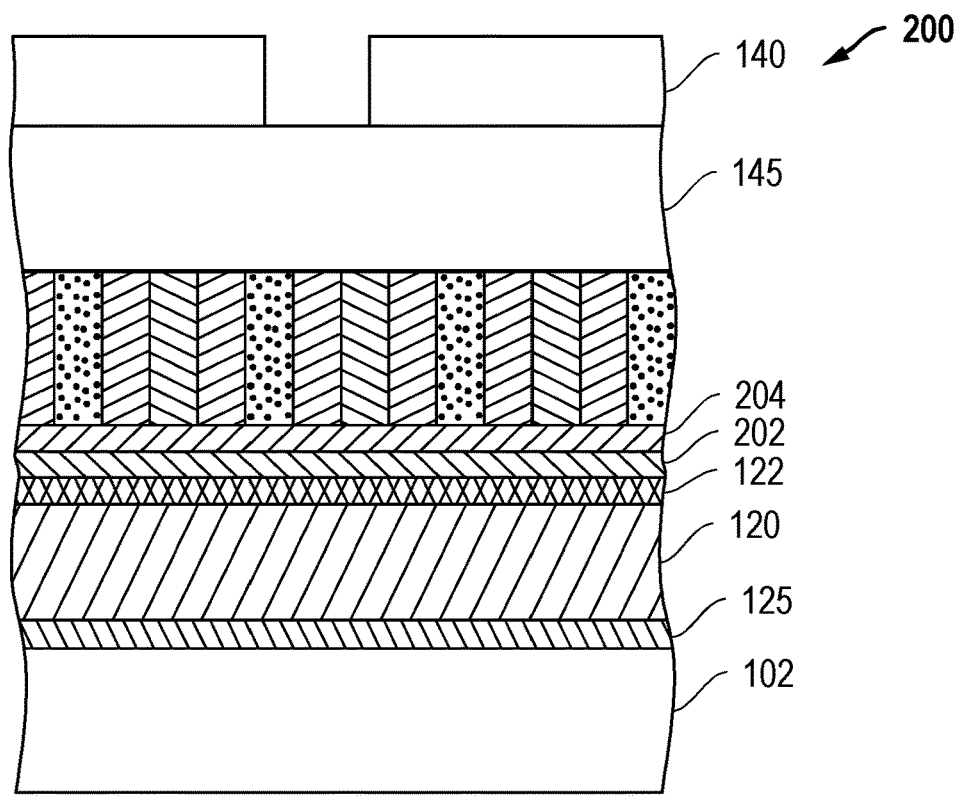
Figure 2C:
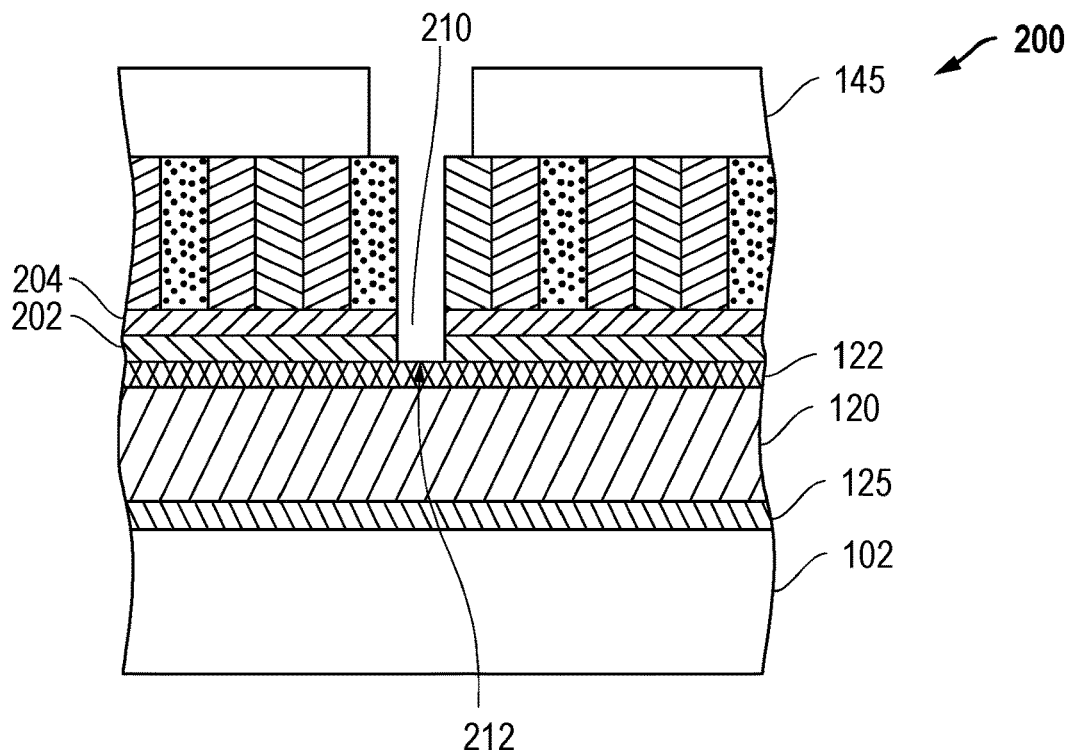
Figure 2D:
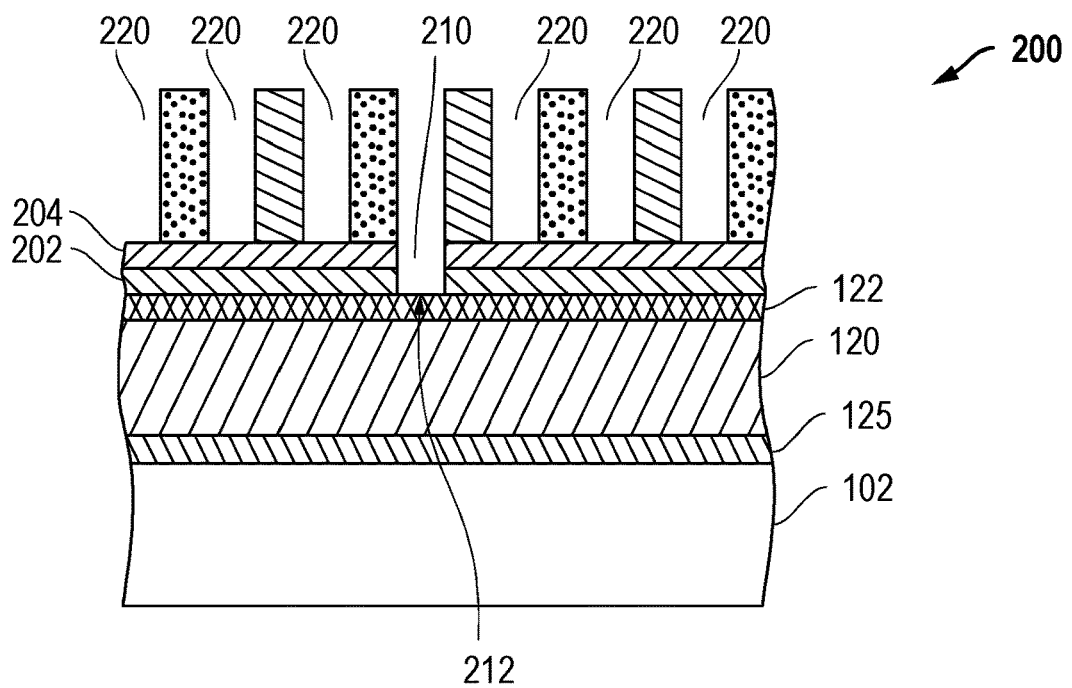
Figure 2E:
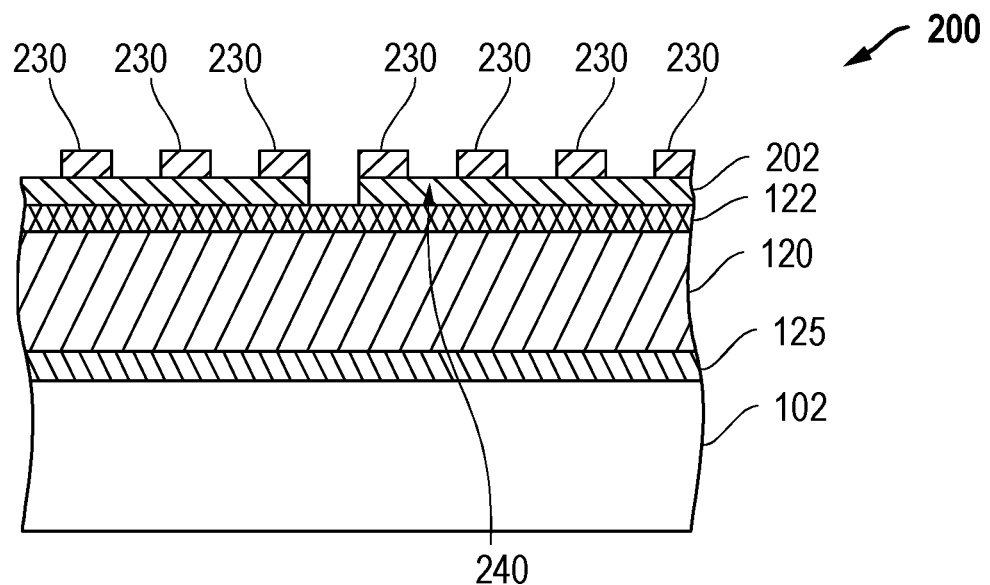
Figure 2F:
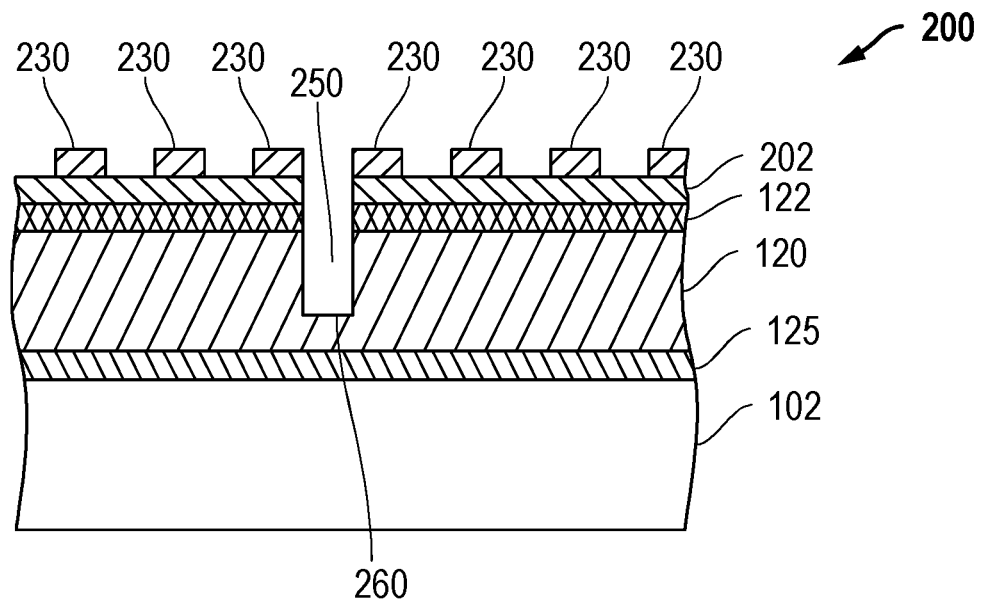

The process flow may then proceed by the formation of additional layers 145 and a via patterned layer 140 as shown in FIG. 2B. Next, an etching may occur to form a via pattern region 210 in the via memorization layer 202 by etching the via pattern through at least one of the spacers 110, and both the trench memorization layer 204 and the via memorization layer 202 as shown in FIG. 2C. Thus, as shown in FIG. 2C the etching may stop at a surface 212 of the first etch stop layer 122. As shown in FIG. 2D, the additional layers 145 may be removed followed by removal of the remaining spacers 110, using first etch stop layer 122 to protect interlayer dielectric layer 120 as shown. The removal of the spacers 110 leaves openings 220. The openings 220 may then be used as a pattern to allow etching of the trench memorization layer 204. FIG. 2E illustrates remaining portions 230 of the trench memorization layer 204. Next as shown in FIG. 2F, a via region 250 may be etched in the interlayer dielectric layer 120. In one embodiment shown in FIG. 2F, the via region 250 may not initially extend completely through the interlayer dielectric layer 120 to the second etch stop layer 125. However in an alternative embodiment, the via region 250 may extend all the way to the second etch stop layer 125.

Figure 2G:
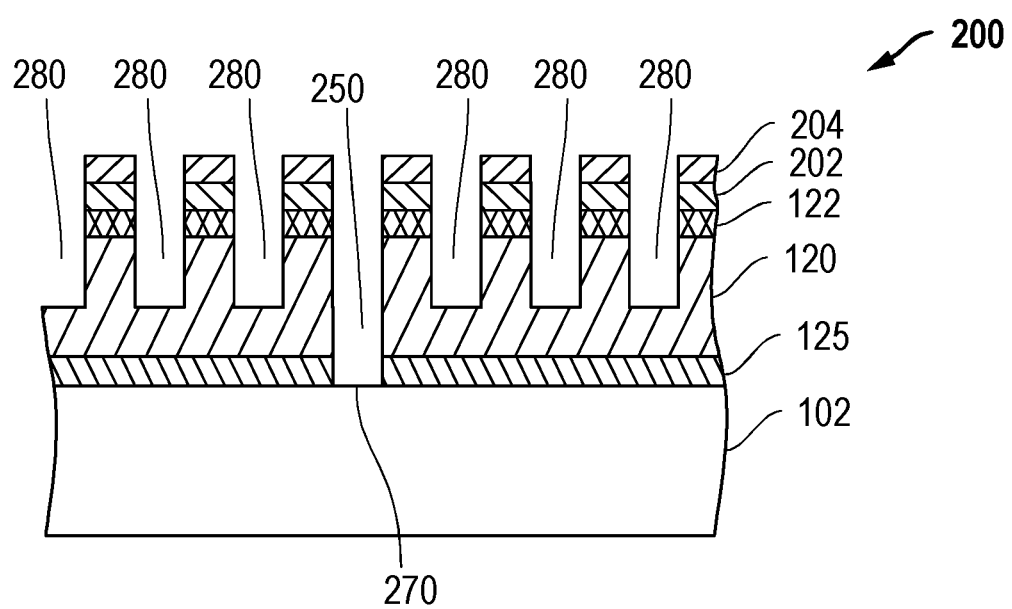

Next as shown in FIG. 2G, a trench etch may be performed using the remaining portions 230 of the trench memorization layer 204 as an etch mask. More specifically, an etch through the via memorization layer 202 may be performed and then an etch through portions of the interlayer dielectric layer 120 may be performed as shown in FIG. 2G. As also shown in FIG. 2G, the remaining portion of the via region 250 may be etched and the second etch stop layer 125 may be etched so that a surface 270 of the underlying layer(s) 102 is exposed. The etching used to form the structure of FIG. 2G from the structure of FIG. 2F may be accomplished as a single etch having multiple etch steps, for example various etch steps tuned to etch the particular layers (the via memorization layer 202, the first etch stop layer 122, the interlayer dielectric layer 120, and the second etch stop layer 125). Alternatively, the etching used to form the structure of FIG. 2G from the structure of FIG. 2F may be accomplished by the use of separate etches (for example in separate etch process tools) for each layer to be etched or a subset of the layers to be etched). The particular approach utilized as to may depend upon the particular materials utilized for the various layers (the via memorization layer 202, the first etch stop layer 122, the interlayer dielectric layer 120, and the second etch stop layer 125) and/or the particular etch chemistries used.

In this manner, trenches 280 and a via region 250 may be formed on the substrate 200. Further, the use of via memorization layer 202 and trench memorization layer 204 may be utilized in the manner shown. This allows for a trench and via formation which does not require filling the via with a via fill layer (such as via fill layer 150 shown in prior art FIG. 1D). Further, because a via fill layer is not utilized a via fill layer etch (or "pull") removing the via fill layer from the via is not required. By providing a process without a via fill layer etch, damage to the low-k interlayer dielectric layer (such as the low-k damage area 170 as shown in prior art FIG. 1G does not occur). The process described, therefore, provides a SAMP multi-color spacer patterning process in which a low-k interlayer dielectric has via and trenches formed with the a low-k interlayer dielectric. Further, the integrity of the low-k characteristics of the low-k interlayer dielectric are maintained by avoiding the low-k damage as described with regard to the prior art techniques.

The SAMP process may be combined with any of SADP, SAQP, SAOP, etc. process flows and can also be created by combining existing semiconductor materials. For example, a core (or mandrel) material, spacer material and gap-fill material may be formed on a variety of layers and materials. Exemplary core/mandrel materials include amorphous carbon, photoresist, silicon oxide, silicon nitride, spin on carbon and silicon. Exemplary spacer materials include silicon oxide, silicon nitride and titanium oxide. Exemplary gap-fill materials include spin on glass, spin on carbon, silicon oxide and titanium oxide. Exemplary etch stop layers may include SiCN, SiOC, aluminum oxide or aluminum nitride. Exemplary low-k interlayer dielectric layers include SiOCH, HSQ or MSQ. It will be recognized that other materials and combinations of materials may be utilized and the materials described above are merely exemplary.

Etch steps are described herein for removing the various layers shown. As used herein, the etch steps may be any of a wide variety of techniques known to remove material from a substrate. For example, the etch steps may include, but are not limited to, dry etch techniques (in one exemplary embodiment plasma etch techniques), wet etch techniques, chemical mechanical planarization techniques, other removal techniques, and/or a combination of such techniques.

In one exemplary embodiment, the mandrels 105 may be silicon, the spacers 110 may be silicon oxide, the filled gaps 115 may be SOC, the interlayer dielectric layer 120 may be SiOCH, the first etch stop layer 122 may be SiOC, the second etch stop layer 125 may be aluminum oxide, the via fill layer 150 may be SOC, the via memorization layer may be Ruthenium and the trench memorization layer may be titanium nitride. In such an embodiment, the spacer etch utilized to achieve the structure of FIG. 2C may be a plasma etch based on fluorocarbon chemistries and chlorine chemistries. The etch steps utilized to etch the first etch stop layer may be a plasma etch based on fluorocarbon chemistries. The etch steps utilized to etch the second etch stop layer may be a plasma etch based on chlorine chemistries. The etch steps utilized to etch the via memorization layer may be a plasma etch based on oxygen and chlorine chemistries. The etch steps utilized to etch the trench memorization layer may be a plasma etch based on chlorine chemistries. The etch steps utilized to etch the interlayer dielectric layer may be a plasma etch based on fluorocarbon chemistries.

Figure 3:
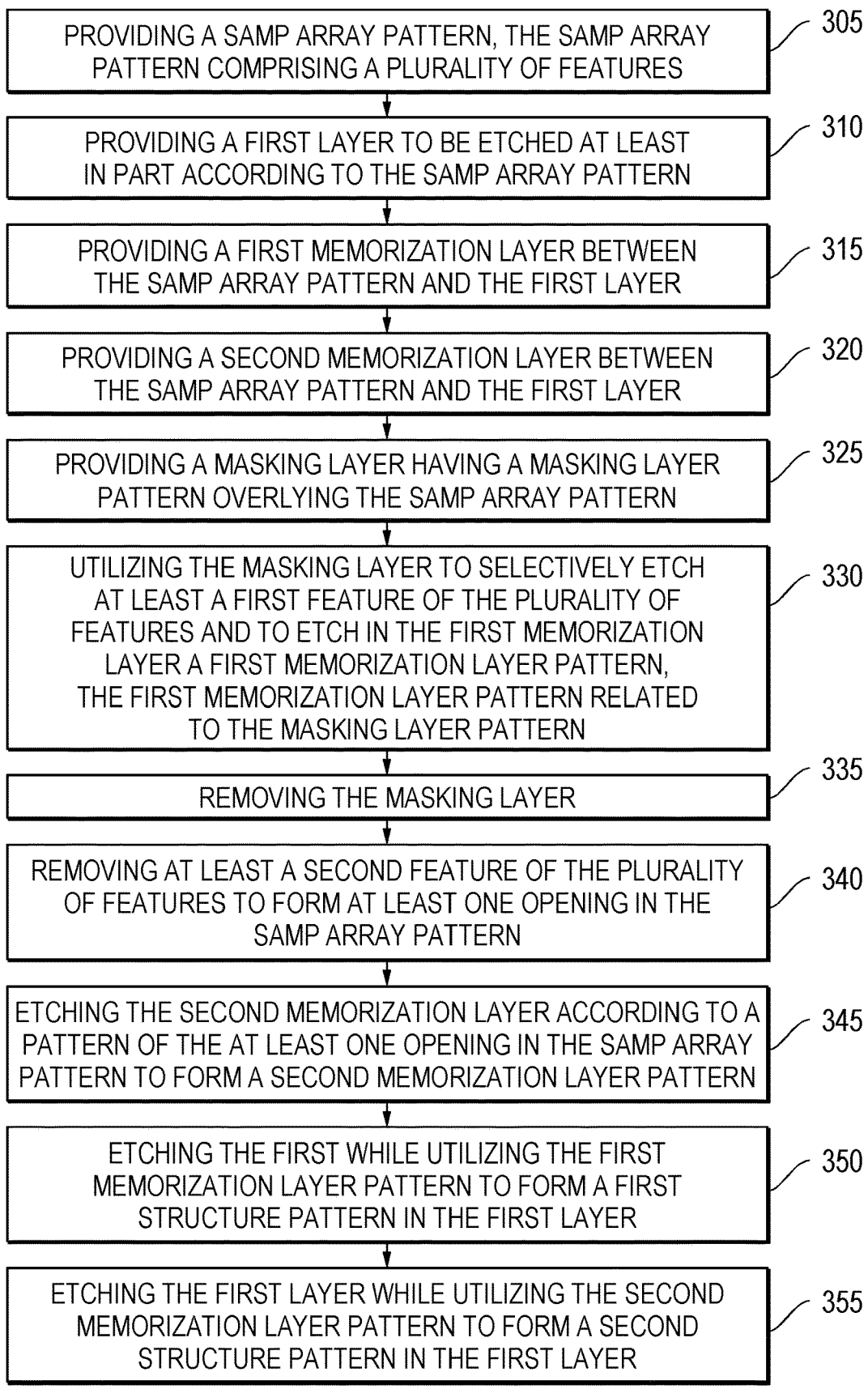
FIGS. 3 and 4 illustrate exemplary methods for using the techniques described herein.
Figure 4:
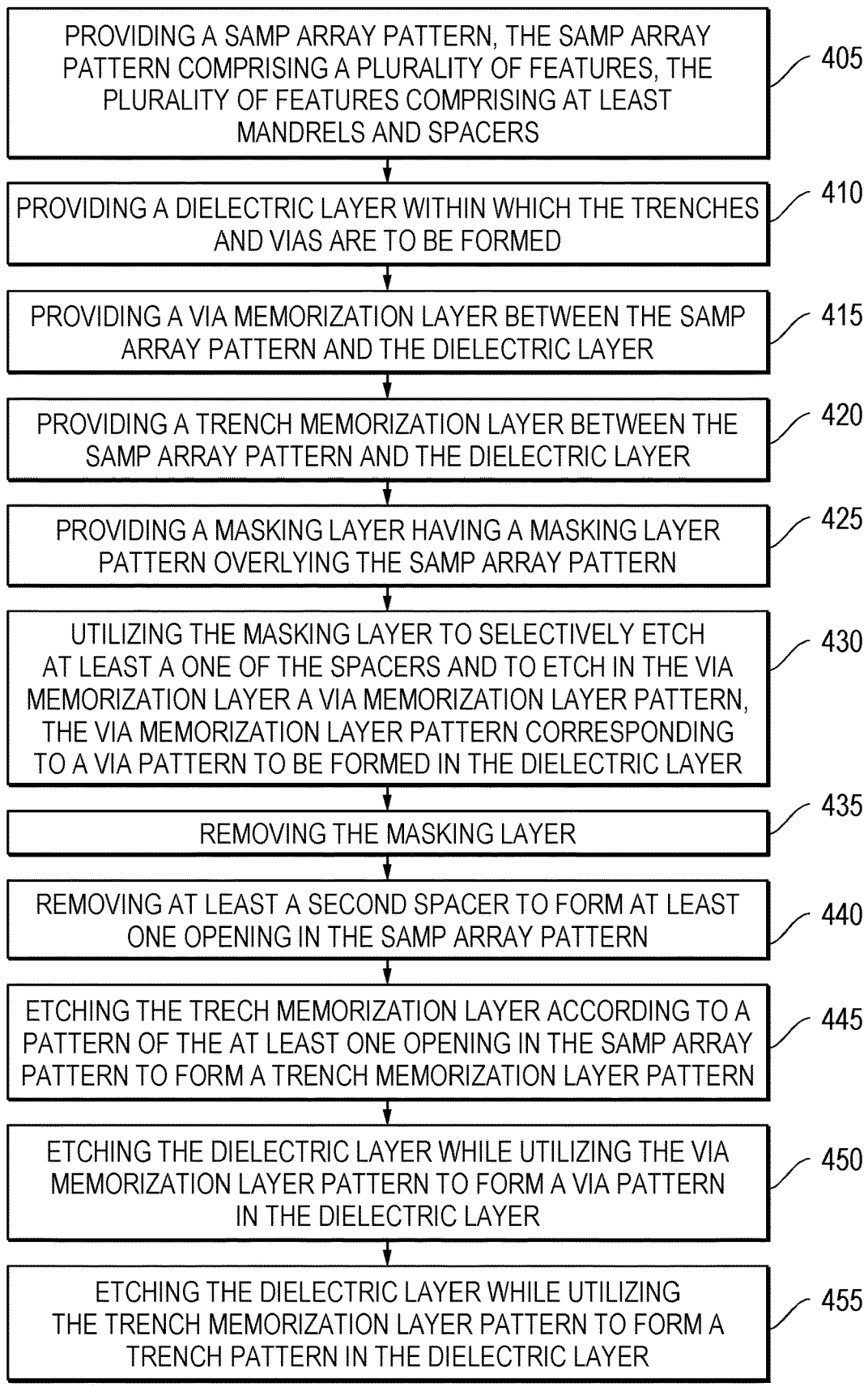

FIGS. 3-4 illustrate exemplary methods for use of the processing techniques described herein. It will be recognized that the embodiments of FIGS. 3-4 are merely exemplary and additional methods may utilize the techniques described herein. Further, additional processing steps may be added to the methods shown in the FIGS. 3-4 as the steps described are not intended to be exclusive. Moreover, the order of the steps is not limited to the order shown in the figures as different orders may occur and/or various steps may be performed in combination or at the same time.

FIG. 3 illustrates a method of forming patterned layers on a substrate using a self-aligned multiple patterning (SAMP) process, the method comprising step 305 of providing a SAMP array pattern, the SAMP array pattern comprising a plurality of features. The method further comprises step 310 of providing a first layer to be etched at least in part according to the SAMP array pattern, step 315 of providing a first memorization layer between the SAMP array pattern and the first layer, step 320 of providing a second memorization layer between the SAMP array pattern and the first layer, and step 325 of providing a masking layer having a masking layer pattern overlying the SAMP array pattern. The method additional comprises step 330 of utilizing the masking layer to selectively etch at least a first feature of the plurality of features and to etch the first memorization layer to form a first memorization layer pattern, the first memorization layer pattern related to the masking layer pattern. The method further comprises a step 335 of removing the masking layer and step 340 of removing at least a second feature of the plurality of features to form at least one opening in the SAMP array pattern. The method further comprises step 345 of etching the second memorization layer according to a pattern of the at least one opening in the SAMP array pattern to form a second memorization layer pattern. The method also comprises step 350 of etching the first layer while utilizing the first memorization layer pattern to form a first structure pattern in the first layer and step 355 of etching the first layer while utilizing the second memorization layer pattern to form a second structure pattern in the first layer.

FIG. 4 illustrates a method of forming trenches and vias on a substrate using a self-aligned multiple patterning (SAMP) process, the method comprising step 405 of providing a SAMP array pattern, the SAMP array pattern comprising a plurality of features, the plurality of features comprising at least mandrels and spacers, step 410 of providing a dielectric layer within which the trenches and vias are to be formed, step 415 of providing a via memorization layer between the SAMP array pattern and the dielectric layer, step 420 of providing a trench memorization layer between the SAMP array pattern and the dielectric layer, and step 425 of providing a masking layer having a masking layer pattern overlying the SAMP array pattern. The method further comprises step 430 of utilizing the masking layer to selectively etch at least a one of the spacers and to etch in the via memorization layer a via memorization layer pattern, the via memorization layer pattern corresponding to a via pattern to be formed in the dielectric layer. The method further comprises step 435 of removing the masking layer and step 440 of removing at least a second spacer to form at least one opening in the SAMP array pattern. The method further comprises step 445 of etching the trench memorization layer according to a pattern of the at least one opening in the SAMP array pattern to form a trench memorization layer pattern, step 450 of etching the dielectric layer while utilizing the via memorization layer pattern to form a via pattern in the dielectric layer and step 455 of etching the dielectric layer while utilizing the trench memorization layer pattern to form a trench pattern in the dielectric layer.

The substrates utilized with the techniques disclosed herein may be any substrates for which the etching and patterning of material is desirable. For example, in one embodiment, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed. For example, when the techniques disclosed herein are utilized to form a trench and via pattern, the substrate may contain all the process layers, structures and patterns of a particular process flow leading up to the desired trench and via formation step. Further, it will be recognized that the SAMP multi-color array shown in FIG. 2A is merely exemplary. The technique of utilizing a via memorization layer and trench memorization layer may be utilized with other techniques for achieving small geometry patterns. Thus, other techniques may be utilized to provide the patterns above the memorization layers as the techniques are not limited to a spacer patterning process.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of forming patterned layers on a substrate using a self-aligned multiple patterning (SAMP) process, comprising:
   providing a SAMP array pattern, the SAMP array pattern comprising a plurality of features;
   providing a first layer to be etched at least in part according to the SAMP array pattern;
   providing an etch stop layer on the first layer;
   providing a first memorization layer on the etch stop layer and between the SAMP array pattern and the first layer;
   providing a second memorization layer between the SAMP array pattern and the first memorization layer;
   providing a masking layer having a masking layer pattern overlying the SAMP array pattern;
   utilizing the masking layer to selectively etch at least a first feature of the plurality of features and to etch the first memorization layer to form a first memorization layer pattern, the first memorization layer pattern related to the masking layer pattern and exposing a first portion of the etch stop layer, the first layer protected by the etch stop layer;
   removing the masking layer;
   removing at least a second feature of the plurality of features to form at least one opening in the SAMP array pattern;
   etching the second memorization layer according to a pattern of the at least one opening in the SAMP array pattern to form a second memorization layer pattern, the etch stop layer protecting the first layer during the etching of the second memorization layer;

etching the exposed first portion of the etch stop layer and the first layer while utilizing the first memorization layer pattern to form a first structure pattern in the first layer; and etching the first memorization pattern, a second portion of the etch stop layer, and the first layer utilizing the second memorization layer pattern to form a second structure pattern in the first layer.

2. The method of claim 1, wherein the first layer is a dielectric layer.

3. The method of claim 2, wherein the dielectric layer is a low-k dielectric layer.

4. The method of claim 3, wherein the first structure pattern is a via pattern and the second structure pattern is a trench pattern.

5. The method of claim 4, wherein the first feature of the plurality of features is a first spacer.

6. The method of claim 4, wherein the second feature of the plurality of features is a second spacer.

7. The method of claim 1, wherein the first feature of the plurality of features is a first spacer.

8. The method of claim 7, wherein the second feature of the plurality of features is a second spacer.

9. The method of claim 1, wherein the etch stop layer comprises SiCN, SiOC, aluminum oxide or aluminum nitride.

10. The method of claim 9, wherein the dielectric layer is a low-k dielectric layer.

11. The method of claim 10, wherein the first structure pattern is a via pattern and the second structure pattern is a trench pattern.

12. A method of forming trenches and vias on a substrate using a self-aligned multiple patterning (SAMP) process, comprising:

providing a SAMP array pattern, the SAMP array pattern comprising a plurality of features, the plurality of features comprising at least mandrels and spacers;

providing a dielectric layer within which the trenches and vias are to be formed;

providing an etch stop layer on the dielectric layer;

providing a via memorization layer on the etch stop layer and between the SAMP array pattern and the dielectric layer;

providing a trench memorization layer between the SAMP array pattern and the dielectric layer;

providing a masking layer having a masking layer pattern overlying the SAMP array pattern;

utilizing the masking layer to selectively etch at least one of the spacers and to etch the first memorization layer to form a via memorization layer pattern, the via memorization layer pattern corresponding to a via pattern to be formed in the dielectric layer and exposing a first portion of the etch stop layer;

removing the masking layer;

removing at least a second spacer to form at least one opening in the SAMP array pattern;

etching the trench memorization layer according to a pattern of the at least one opening in the SAMP array pattern to form a trench memorization layer pattern, the etch stop layer protecting the dielectric layer during etching of the trench memorization layer;

etching the exposed first portion of the etch stop layer and the dielectric layer while utilizing the via memorization layer pattern to form a via pattern in the dielectric layer; and etching a second portion of the etch stop layer, the via memorization pattern, and the dielectric layer while utilizing the trench memorization layer pattern to form a trench pattern in the dielectric layer.

13. The method of claim 12, wherein the via memorization layer underlies the trench layer memorization layer.

14. The method of claim 13, further comprising:

after forming the via pattern in the dielectric layer, utilizing the trench memorization layer pattern to etch exposed portions of the via memorization pattern.

15. The method of claim 14, wherein the dielectric layer is a low-k dielectric layer.

16. The method of claim 14, wherein the etch stop layer is utilized to protect at least a portion of the dielectric layer while removing the at least the second spacer to form the at least one opening in the SAMP array pattern.

17. The method of claim 12, wherein the dielectric layer is a low-k dielectric layer.

18. The method of claim 12, wherein the etch stop layer is SiCN, SiOC, aluminum oxide or aluminum nitride.

* * * * *